United States Patent [19]

Maas et al.

[11] Patent Number: 4,619,039
[45] Date of Patent: * Oct. 28, 1986

[54] METHOD OF MANUFACTURING A SEMICONDUCTOR DEVICE AND DEVICE MANUFACTURED BY THE USE OF THE METHOD

[75] Inventors: Henricus G. R. Maas; Jan W. Slotboom; Johannes A. Appels; Kazimierz Osinski, all of Eindhoven, Netherlands

[73] Assignee: U.S. Philips Corporation, New York, N.Y.

[ * ] Notice: The portion of the term of this patent subsequent to Mar. 11, 2003 has been disclaimed.

[21] Appl. No.: 657,644

[22] Filed: Oct. 4, 1984

[30] Foreign Application Priority Data

Jul. 13, 1984 [NL] Netherlands ............... 8402223

[51] Int. Cl.⁴ .................................... H01L 21/90
[52] U.S. Cl. .................... 29/591; 29/589; 29/590; 29/578; 29/571; 29/577 C; 156/653
[58] Field of Search ............ 29/589, 590, 591, 578, 29/577 C, 571; 156/649, 653, 659.1, 660, 661.1

[56] References Cited

U.S. PATENT DOCUMENTS

| | | | |
|---|---|---|---|
| 4,328,611 | 5/1982 | Harrington et al. | 29/578 |
| 4,348,804 | 9/1982 | Ogawa et al. | 29/578 |
| 4,379,001 | 4/1983 | Sakai et al. | 29/578 |
| 4,402,128 | 9/1983 | Blackstone | 29/591 |
| 4,424,621 | 1/1984 | Abbas et al. | 29/578 |
| 4,449,287 | 5/1984 | Maas et al. | 29/578 |
| 4,574,468 | 5/1986 | Slotboom et al. | 29/577 C |

FOREIGN PATENT DOCUMENTS

54-27113 9/1979 Japan.
2111304A 6/1983 United Kingdom.

Primary Examiner—Brian E. Hearn
Assistant Examiner—Hunter L. Auyang
Attorney, Agent, or Firm—Paul R. Miller

[57] ABSTRACT

A method of manufacturing a semiconductor device having narrow, coplanar, silicon electrodes which are separated from each other by grooves or slots having a width in the submicron range. The electrodes are alternatively covered by an oxide and by an oxidation-preventing layer, such as silicon nitride. According to the invention, a first and second electrode which are both covered with one of these layers, and which enclose a third electrode covered by the other of these layers, are first interconnected inside a connection region. Two of the three electrodes are separated from the connection region by etching. By selective etching, overlapping contact windows are provided on all three electrodes, and inside the contact windows etching of the groove is omitted.

7 Claims, 12 Drawing Figures

METHOD OF MANUFACTURING A SEMICONDUCTOR DEVICE AND DEVICE MANUFACTURED BY THE USE OF THE METHOD

The invention relates to a method of manufacturing a semiconductor device having a plurality of adjacent narrow closely spaced coplanar silicon electrodes, which method comprises the following processing steps:

(a) depositing on an electrically insulating layer successively a first silicon layer, an oxidation-preventing layer and a second silicon layer;
(b) etching the second silicon layer in a pattern comprising a plurality of parallel silicon strips;
(c) partially oxidizing the second silicon layer for forming an oxidized edge portion thereof;
(d) etching away the uncovered parts of the oxidation-preventing layer;
(e) etching away the exposed silicon oxide;
(f) carrying out a thermal oxidation for obtaining parts of the first silicon layer covered alternately by an oxide layer and by the oxidation-preventing layer;
(g) selectively etching away the uncovered parts of the oxidation-preventing layer, and
(h) etching grooves into the parts of the first silicon layer thus exposed for forming a silicon electrodes alternately covered by the oxide layer and by the oxidation-preventing layer.

The invention further relates to a semiconductor device manufactured by using the method.

A method of the kind described above is known from the published British Patent Application GB-A No. 2,111,304 of the Applicant corresponding to U.S. Pat. No. 4,449,287. This Application describes the manufacture of a charge-coupled semiconductor device (CCD), in which in a self-registered manner gate electrodes of silicon are formed, whose very small spacing of, for example, less than 1 µm is determined by the lateral oxidation of a silicon pattern with, these gate electrodes being alternately covered by oxide and by an oxidation-preventing layer of, for example, silicon nitride.

Thus, it is possible to avoid overlapping gate electrodes and hence a double-layer electrode system, which has great advantages in technological and electrical respect.

However, problems often arise when contacting a large number of very narrow and closely spaced electrodes. Since it is difficult to provide contacts on very narrow electrodes, the electrodes can be caused to extend at one or both ends outwards in the form of a fan, but this requires space. Furthermore, the silicon electrodes will have to be provided in mutually separated groups, for which purpose interruptions will have to be formed in the first silicon layer. According to the method described in GB-A No. 2,111,304, this is effected in that at the areas at which no silicon layer has to be present in the finished device the second silicon layer is converted already at the beginning of the process throughout its thickness into silicon oxide. However, this requires a masking and oxidation step. The interruptions in the first silicon layer are then obtained automatically during the processing step of forming the grooves between the strip-shaped silicon electrodes.

When the known process is carried out without further expedients, the contact windows provided in the oxide and the etching masks used for the this purpose, respectively, must not overlap the adjacent electrodes. In fact this would result in that the oxide in the intermediate groove is etched away. At areas at which only a thin oxide layer is present under the groove, short circuits can then occur with a metallization provided later. However, when no (overlapping) contact windows can be provided, this means loss of space.

The present invention has inter alia for its object to provide an improved method, by which "overlapping" contact windows can be formed.

According to the invention, a method of the kind mentioned in the preamble is characterized in that (j) the pattern is given such a configuration that after the processing step (h) a connection region is formed which comprises the ends interconnected via the first silicon layer of a first and a second silicon electrode covered by the one layer and the part enclosed by these ends of an intermediate third silicon electrode covered by the other layer;
(k) two of the three silicon electrodes are separated from the connection region by etching;
(l) the grooves are filled at least in part with oxide by thermal oxidation;
(m) the silicon electrode not separated from the connection region is provided inside this region with a contact window by selectively etching the layer covering this electrode via an etching mask overlapping at least one adjoining silicon electrode, and
(n) the two other silicon electrodes are provided outside the connection region with contact windows by selectively etching the layer covering these electrodes.

The invention offers, as will be explained more fully hereinafter, not only the possibility of forming overlapping contact windows, but also of avoiding or reducing given parasitic capacitances.

At areas at which only a thin (gate) oxide layer is present at the contact window under the groove, according to a preferred embodiment, the groove is not etched. This may be effected in different ways.

According to a first modification, at the area (or areas) at which etching of the groove must be omitted, the uncovered part of the oxidation-preventing layer can be etched away between the processing steps (e) and (f).

Another possibility consists in that at the area at which etching of the groove must be omitted the uncovered part of the oxidation-preventing layer is masked against etching during the processing step (g).

According to a third modification, at the area at which etching of the groove must be omitted the oxidized edge portion of the second silicon layer is etched away between the processing steps (c) and (d).

Finally, according to a fourth method, at the area at which etching of the groove must be omitted, a silicon oxide layer is provided under the oxidation-preventing layer.

The invention will now be explained more fully with reference to a few embodiments and the drawing, in which.

The Figures are purely schematic and not drawn to scale for the sake of clarity. This particularly holds for the dimensions in the direction of thickness of the cross-sections. Corresponding parts are generally designated by the same reference numerals in the various Figures.

Figure 1:
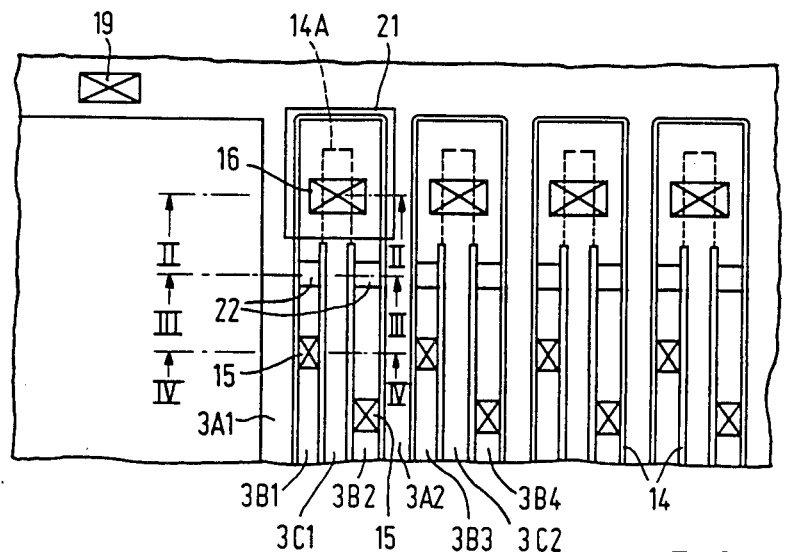
FIG. 1 is a plan view of a device obtained by the use of the invention.
Figure 2:
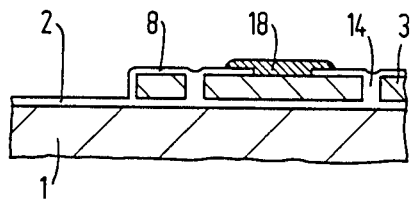
FIGS. 2 to 4 shows diagrammatically cross-sections of the device of FIG. 1 taken on the lines II—II, III—III and IV—IV.
Figure 3:
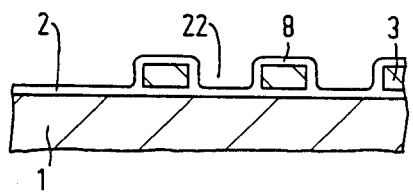
Figure 4:
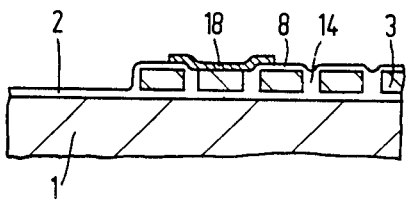
Figure 5:
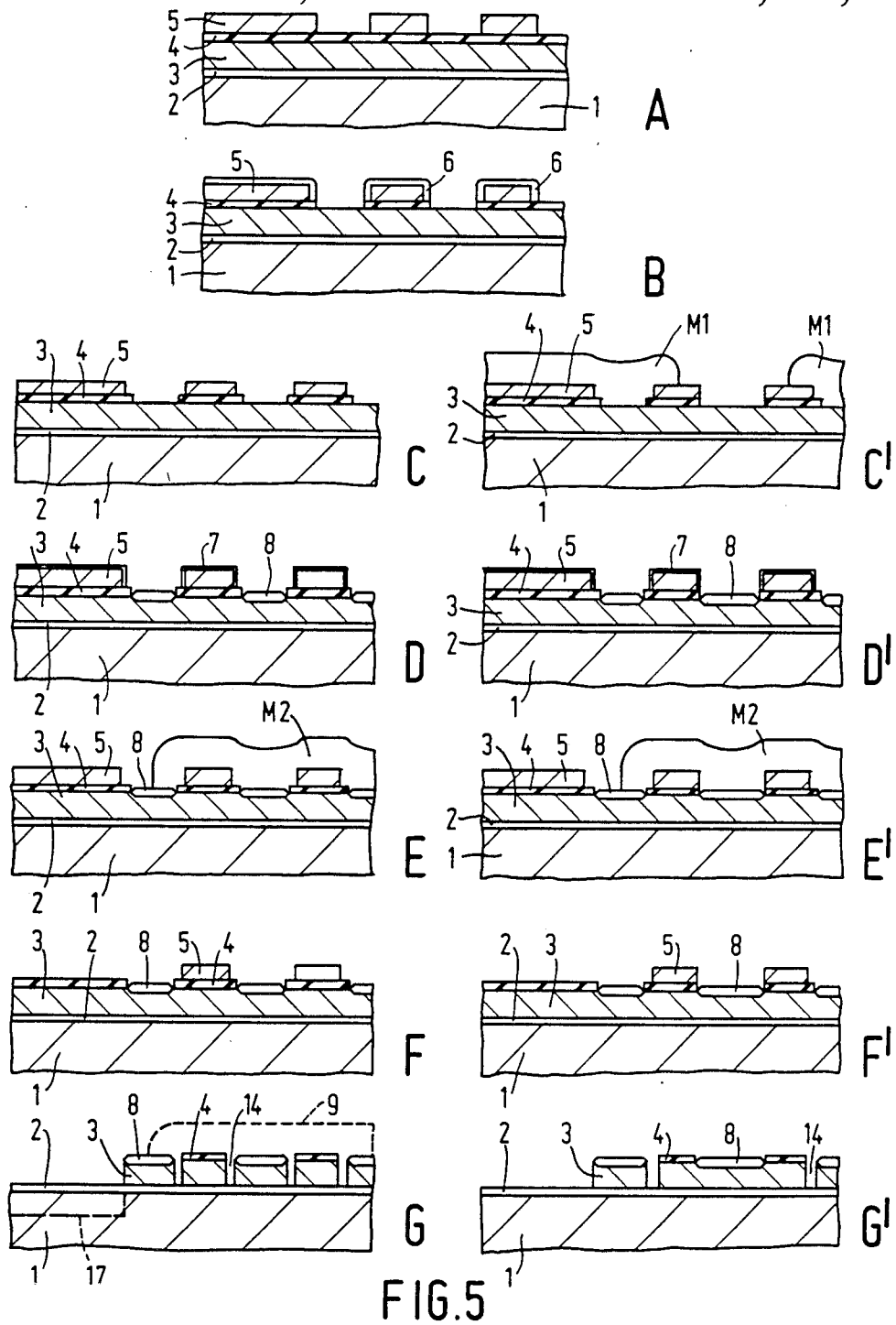
FIG. 5 shows diagrammatically in cross-section successive stages of the manufacture of the device shown in FIGS. 1 to 4.

FIG. 1 shows in plan view an example of a semiconductor device manufactured by the use of the method according to the invention. This device comprises a plurality of adjacent narrow and coplanar silicon electrodes $3A_{1...n}$, $3B_{1...n}$ and 3CHd 1 . . . n at a very small relative distance. These electrodes, of which only the environment of the part to be contacted is shown here, may form, for example, the gate electrodes of a charge-coupled device (CCD). The cross-sections taken on the lines II—II, III—III and IV—IV are shown in FIGS. 2, 3 and 4, respectively. The electrodes are separated from each other by narrow grooves or slots 14 filled at least in part with silicon oxide. They are very narrow and have a width of, for example, 1.5 μm, as a result of which their contacting involves a problem which can generally be solved only at the expense of additional space. The invention provides a method in which contacting can take place substantially without loss of space due to a high degree of self-alignment.

FIGS. 5A to 5G show cross-sections of the device of FIG. 1 at successive stages of manufacture. FIGS. 5C to 5G more particularly relate to the cross-section IV—IV and FIGS. 5C' to 5G' to the cross-section II—II of FIG. 1.

The starting material is a substrate consisting of an electrically insulating layer. In this example, the latter consists of a layer 2 of silicon oxide which is located on a silicon layer 1. There are successively deposited on this insulating layer 2 (see FIG. 5A) a first highly doped n-type silicon layer 3, an oxidation-preventing layer 4 and a second undoped silicon layer 5. The silicon layers may consist of polycrystalline silicon, but also of, for example, amorphous silicon, while monocrystalline silicon could also be used, although technological difficulties would be involved in providing this material. The oxidation-preventing layer 4 may be made of silicon nitride or of another layer preferably comprising silicon nitride, such as, for example, silicon oxynitride.

Subsequently, the second silicon layer 5 is given by masking and etching a pattern which comprises a plurality of parallel silicon strips. Thus, the structure of FIG. 5A is obtained.

The silicon pattern formed from the second silicon layer 5 is then partially oxidized. An oxidized edge portion 6 is thereby formed at the edges. Thereafter, the now uncovered part of the oxidation-preventing layer 4 is etched away, as a result of which the situation shown in FIG. 5B is obtained.

The exposed silicon oxide is now etched away, as a result of which the situation shown in FIG. 5C' is obtained. In the cross-section of FIG. 5C', while using a photolacquer mask M1, the edges of the oxidation-preventing layer 4 projecting below the silicon strips are then etched away alternately on the righthand and on the lefthand side (see FIG. 5C'). In the cross-sections III—III and IV—IV shown in FIG. 5C, these edges remain in tact.

Subsequently, after removing the mask M1, a thermal oxidation is carried out, in which there is formed on the exposed highly doped parts of the silicon layer 3 an oxide layer 8 which is thicker than the thin oxide layer 7 on the substantially undoped strips of the layer 5 (see FIGS. 5D and D'). Thus, parts of the first silicon layer 3 alternately covered by oxide 8 and by the oxidation-preventing layer 4 are obtained. Subsequently, the thin oxide layer 7 is removed by a dip-etching step.

A photolacquer mask M2 is now provided (see FIGS. 5E and E'), which covers the electrode strips to be formed and other parts of the silicon layer 3 which should be maintained as interconnections etc. The uncovered parts of the second silicon layer 5 are now removed by etching, after which the mask M2 is removed (see FIGS. 5F and 5F'). The parts of the silicon layer 5 now removed were located above the areas at which in the finished device the first silicon layer 3 has to be absent.

The aforementioned uncovered edge portions of the layer 4 projecting below the strips of the layer 5 and the remaining uncovered parts of the oxidation-preventing layer 4 are now removed, whereupon the exposed parts of the silicon layer 3 and hence also the remaining parts of the layer 5 are etched away. Thus, grooves 14 are formed in the layer 3. At the areas at which, whilst using the photolacquer mask M1 (see FIG. 5C'), the projecting edges of the layer 4 are removed, no grooves are formed (see FIG. 5C').

As appears in particular from FIGS. 1 and 2, according to the invention, when the second silicon layer 3 is patterned, this pattern is given such a configuration that after the operations described above a connection region is obtained which comprises the two ends interconnected via the first silicon layer of a first (3B1) and a second (3B2) silicon electrode, which are both covered with the same layer (in this example the oxidation-preventing layer 4), and the part enclosed by these ends of the intermediate third silicon electrode 3C1 covered with the other layer (so in this example with the oxide layer 8). This connection region is indicated in FIG. 1 by the line 21.

According to the invention, in the preceding processing step, also two of the three silicon electrodes 3B1, 3B2 and 3C1 were separated from the connection region 21 by etching. In this example, these electrodes are the electrodes 3B1 and 3B2; the areas at which these electrodes are etched through are designated in FIG. 1 by reference numeral 22. In other modifications of the method, it may be advantageous under certain circumstances to realize the separation 22 in a separate etching step.

Everywhere except at the areas (15) at which the electrodes covered by the oxidation-preventing layer 4 have to be contacted, this layer 4 is now removed. By thermal oxidation, an oxide layer is then formed on all the silicon parts thus exposed, the grooves 14 being filled at least in part with oxide (see FIGS. 2 and 4).

Inside the connection region 21, the electrode not separated from this connection region, so in this example the electrode 3C1, is provided with a contact window. This is effected by selectively etching the oxide layer via an etching mask 16 overlapping the electrodes, 3B1 and 3B2 (see FIG. 1). Subsequently, without a mask, the layer 4 is removed by selective etching, as a result of which at the areas 15 (see FIG. 1) contact windows are formed automatically on the electrodes 3B1 and 3B2 outside the connection region 21. The electrodes 3A1 ... n are contacted via a common contact window 19, which can be provided simultaneously with the window 16.

The electrodes are now contacted in a usual manner with conductor tracks 18, which in the cross-sections of FIGS. 2 and 4 are shown diagrammatically, but for the sake of clarity are not shown in FIG. 1.

At the areas at which zones adjoining the electrodes, for example source and drain zones, are desired, these zones (17) may be obtained, for example, by ion implantation by means of a non-critical photolacquer mask 9; this is indicated by dotted lines in FIG. 5G.

Due to the fact that inside the connection region 21 the grooves 14 are absent (dotted lines 14A), the oxide layer 2 is not attacked by the process of etching the window 16 so that during metallization no short-circuit can occur between the conductive layer 18 and the silicon region 1. When the oxide layer 2 is sufficiently thick, the grooves 14 may be present everywhere. An additional advantage is that in the example at the crossings between the metal tracks 18 and the silicon electrodes the tracks 18 extend everywhere over oxide, as a result of which the capacitance at the crossings is reduced.

Figure 6:
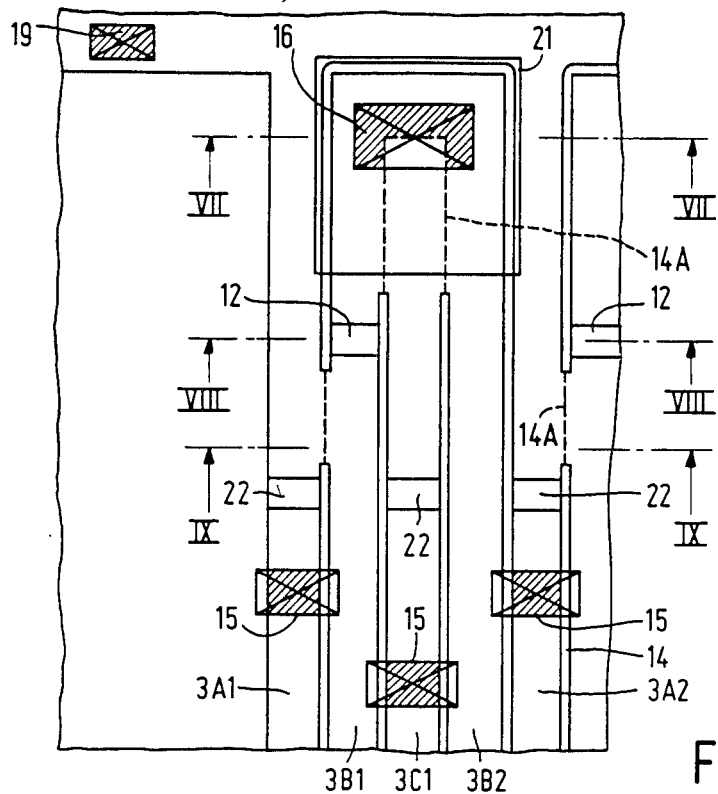
FIG. 6 is a plan view of a device obtained by the use of a modification of the method according to the invention.
Figure 7:
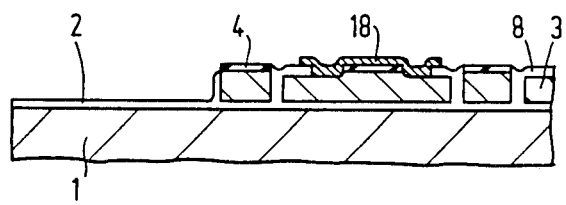
FIGS. 7 to 9 show diagrammatically cross-sections of the device shown in FIG. 6 taken on the lines VII—VII, VIII—VIII and IX—IX.
Figure 8:
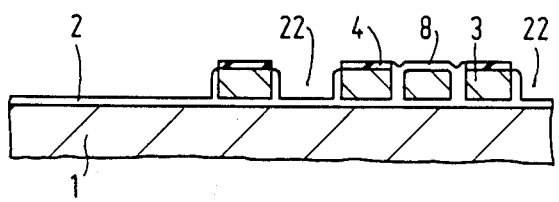
Figure 9:
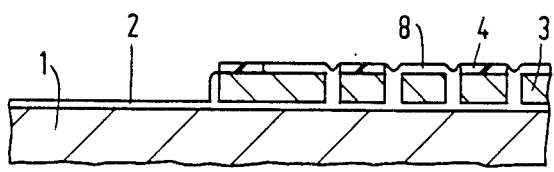

The method described may also be carried out in manners different from that described in this example. For example, in the configuration of FIG. 1 the electrodes 3B1 ... n may be covered with oxide and the electrodes 3A1 ... n and 3C1 ... n may be covered with silicon nitride or another oxidation-preventing layer. In that case, for example the electrodes 3B1 and 3C1 are etched loose from the connection region 21, while the electrode 3B2 remains connected with the region 21. See FIG. 6, in which corresponding parts are designated by the same reference numerals as in FIGS. 1 to 5. The semiconductor surfaces to be contacted, which are exposed inside the contact windows indicated by diagonal lines, are indicated in FIG. 6 by cross-hatched lines. The configuration shown can be obtained by means of the same processing steps as in the preceding example, but in this case the respective covering layers of the electrodes are maintained. In the manner shown in FIG. 6, at 16 an overlapping contact window may be formed in the oxide 8 on the electrode 3B2 and at 15 contact windows may be formed in the oxidation-preventing silicon nitride layer 4 on the electrodes 3A₁ ... n and 3C₁...ₙ. Via the common contact window 19, the electrodes 3B₁...ₙ can be contacted. For this purpose, the grooves 14 are not formed at the areas indicated by dotted lines 14A.

Instead of a highly doped silicon layer 3 and a weakly doped or undoped silicon layer 5, two substantially equally doped silicon layers may also be used. In this case, however, a second oxidation-preventing layer has to be provided on the second silicon layer 5, in order to avoid that during the thermal oxidation according to the step f (FIG. 5D) on top of the layer 5 an oxide layer is formed which cannot be removed by a dip-etching step.

Figure 10:
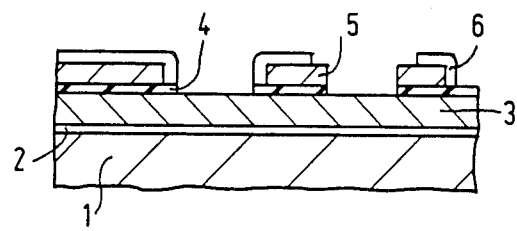
FIGS. 10, 11 and 12 shows other modifications according to which etching of grooves can be locally avoided.

The local absence of the grooves 14, which in the example described in FIGS. 5A to 5G was attained by (see FIG. 5C') locally etching away the projecting edges of the oxidation-preventing layer 4 prior to the thermal oxidation in which the oxide 8 is formed, may also be realized in a different manner. Instead, for example, at the areas at which no groove should be formed, the oxide edge 6 may be removed by etching before the thermal oxidation. Instead of the situation of FIG. 5B, the situation of FIG. 10 is then obtained. The further processing steps are analogous to those of the example of FIG. 5A–5G.

Figure 11:
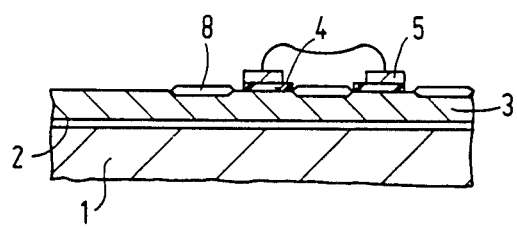

According to another modification, in the situation of FIG. 5F at the area at which no groove should be formed the projecting edge of the layer 4 is protected from etching so that after etching the situation of FIG. 11 is obtained, which after removal of the etching mask and after the step of etching the layer 3 results in the same situation as that shown in FIG. 5G'.

Figure 12:
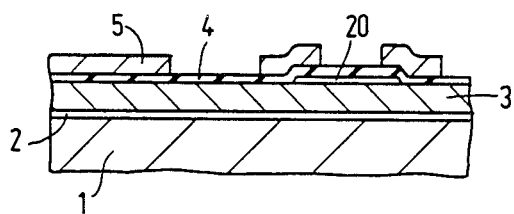

Finally, at the area at which the groove 14 should not be formed, an oxide layer 20 may be provided under the oxidation-preventing layer 4 (see FIG. 12). Also in this case, after the same processing steps as in FIGS. 5A–5G, the situation of FIG. 5G' is obtained because after the step of etching the layer 4, the silicon 3 at the areas at which no groove should be formed remains covered with the oxide 20, which masks against the step of etching the layer 3.

The invention is not limited to the embodiments described. For example, the invention may also be used in devices other than CCD's. Furthermore, the layer 2A may consist of an insulating material other than silicon oxide, while the oxidation-preventing layer may consist of materials other than silicon nitride or silicon oxynitride provided that these materials can be etched selectively with respect to silicon oxide.

What is claimed is:

1. A method of manufacturing a semiconductor device having a plurality of adjacent narrow, closely spaced coplanar silicon electrodes, said method comprising the steps of:
    (a) depositing on an electrically insulating layer successively a first silicon layer, an oxidation preventing layer, and a second silicon layer;
    (b) etching said second silicon layer in a pattern comprising a plurality of parallel silicon strips separated by spacings;
    (c) partially oxidizing said pattern to form oxidized edge portions of said pattern;
    (d) selectively removing by etching parts of said oxidation preventing layer uncovered by said oxidized pattern;
    (e) selectively removing said oxidized edge portions by etching to expose edges of said oxidation preventing layer projecting from under said parallel silicon strips;
    (f) applying a first mask to cover said pattern including said spacings except for an area to be situated over a connection region of said first silicon layer;
    (g) removing exposed projecting edges of said oxidation preventing layer by etching in said connection region, and removing said first mask thereafter;
    (h) oxidizing exposed portion of said first silicon layer in strip-shaped parts of said first silicon layer, said strip-shaped parts being alternately covered by an oxide layer and by said oxidation preventing layer;
    (i) applying a second mask over said strip-shaped parts of said first silicon layer and over parts of said first silicon layer to be maintained for interconnections, and etching away unmasked parts of said second silicon layer;
    (j) removing selectively exposed parts of said oxidation preventing layer including said exposed projecting edges, and then removing underlying parts of said first silicon layer to form silicon electrodes separated by grooves, said silicon electrodes comprising at least one group of three adjacent parallel silicon electrodes interconnected by said connection region;

(k) filling said grooves at least in part with oxide by thermal oxidation;

(l) separating, in said at least one group, two of said three adjacent silicon electrodes from said connection region and a remaining electrode of said one group by etching to remove selectively area of said first silicon layer;

(m) providing a contact window inside said connection region by selective etching of a layer covering said remaining electrode by using an etching mask overlapping at least one adjacent silicon electrode in a self-aligned manner; and (n) providing said two silicon electrodes of said group with contact with windows by selectively etching a layer covering said other two electrodes in a self-aligned manner.

2. A method according to claim 1, wherein said grooves are not formed at least in the area of said contact windows.

3. A method according to claim 2, wherein at an area where at least one of said grooves is not formed, uncovered parts of said oxidation preventing layer are covered during step (i) with said second mask.

4. A method according to claim 2, wherein at an area where at least one of said grooves is not formed, the oxidized edge portions of said second silicon layer are etched away between steps (c) and (d).

5. A method according to claim 1 or claim 2 or claim 3 or claim 4, wherein after step (j) said oxidation preventing layer is etched away except at an area at which said contact windows are to be provided; wherein said step (k) of thermal oxidation is then carried out; and wherein said oxidation preventing layer is subsequently etched away without a mask.

6. A method according to claim 1 or claim 2 or claim 3 or claim 4, wherein said two silicon electrodes are covered by another oxidation preventing layer.

7. A method according to claim 1 or claim 2 or claim 3 or claim 4, wherein said second silicon layer is removed between steps (h) and (j) above areas at which said first silicon layer is to be absent.

* * * * *